United States Patent
Suzuki et al.

(10) Patent No.: US 9,749,561 B2
(45) Date of Patent: Aug. 29, 2017

(54) SOLID-STATE IMAGE PICKUP DEVICE AND METHOD FOR MANUFACTURING SOLID-STATE IMAGE PICKUP DEVICE

(71) Applicant: HAMAMATSU PHOTONICS K.K., Hamamatsu-shi, Shizuoka (JP)

(72) Inventors: Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/766,788

(22) PCT Filed: Feb. 12, 2014

(86) PCT No.: PCT/JP2014/053185
§ 371 (c)(1),
(2) Date: Aug. 10, 2015

(87) PCT Pub. No.: WO2014/126100
PCT Pub. Date: Aug. 21, 2014

(65) Prior Publication Data
US 2015/0365613 A1    Dec. 17, 2015

(30) Foreign Application Priority Data
Feb. 13, 2013    (JP) ................ 2013-025620

(51) Int. Cl.
*H04N 3/14*    (2006.01)
*H04N 5/335*    (2011.01)
(Continued)

(52) U.S. Cl.
CPC ....... *H04N 5/369* (2013.01); *H01L 27/14683* (2013.01); *H01L 27/14806* (2013.01);
(Continued)

(58) Field of Classification Search
CPC ........ H04N 5/369; H04N 5/335; H04N 5/353; H04N 5/372; H04N 5/37206; H04N 3/1525
(Continued)

(56) References Cited

U.S. PATENT DOCUMENTS 5,298,761 A     3/1994 Aoki et al.
6,048,785 A  *  4/2000 Fulford, Jr. ....... H01L 21/76895
                                                  257/E21.59
(Continued)

FOREIGN PATENT DOCUMENTS

CN    101350886    1/2009
CN    101682701    3/2010
(Continued)

OTHER PUBLICATIONS

English-language translation of International Preliminary Report on Patentability (IPRP) dated Aug. 27, 2015 that issued in WO Patent Application No. PCT/JP2014/053185.

*Primary Examiner* — Kelly L Jerabek
(74) *Attorney, Agent, or Firm* — Drinker Biddle & Reath LLP

(57) ABSTRACT

A solid-state imaging device includes a light receiving section formed by such exposure as to stitch a plurality of patterns in a first direction on a semiconductor substrate. The light receiving section includes a plurality of pixels disposed in a two-dimensional array in the first direction and a second direction perpendicular to the first direction. Electric charges are transferred in the second direction in each of pixel columns consisting of a plurality of pixels disposed in the second direction, among the plurality of pixels.

4 Claims, 7 Drawing Sheets

(51) Int. Cl.
*H04N 9/04* (2006.01)
*H01L 31/062* (2012.01)
*H01L 31/113* (2006.01)
*H04N 5/369* (2011.01)
*H01L 27/148* (2006.01)
*H04N 5/353* (2011.01)
*H01L 27/146* (2006.01)

(52) U.S. Cl.
CPC .. *H01L 27/14812* (2013.01); *H01L 27/14831* (2013.01); *H01L 27/14856* (2013.01); *H04N 5/353* (2013.01)

(58) Field of Classification Search
USPC .............. 348/281, 282, 294, 295, 308, 311; 257/291; 250/208.1
See application file for complete search history.

(56) References Cited

U.S. PATENT DOCUMENTS

| | | | | |
|---|---|---|---|---|
| 7,737,390 | B2* | 6/2010 | Sarig | H01L 27/14643 250/208.1 |
| 8,866,890 | B2* | 10/2014 | Van Arendonk | H04N 5/2253 348/47 |
| 2008/0254564 | A1 | 10/2008 | Kimura et al. | |
| 2009/0021606 | A1* | 1/2009 | Kuruma | H04N 5/3653 348/231.99 |
| 2009/0268983 | A1* | 10/2009 | Stone | H04N 3/1593 382/284 |
| 2010/0128150 | A1* | 5/2010 | Taguchi | H04N 5/2176 348/243 |
| 2012/0113213 | A1* | 5/2012 | Van Arendonk | H04N 5/3415 348/36 |
| 2013/0057739 | A1* | 3/2013 | Lazovsky | H04N 5/347 348/295 |
| 2013/0107097 | A1* | 5/2013 | Suyama | H04N 5/2253 348/308 |

FOREIGN PATENT DOCUMENTS

| | | |
|---|---|---|
| JP | 2000-101061 A | 4/2000 |
| JP | 2001-077343 A | 3/2001 |
| JP | 2003-179221 A | 6/2003 |
| JP | 2003-280173 A | 10/2003 |
| JP | 2003-347539 A | 12/2003 |
| JP | 2008-263050 A | 10/2008 |
| JP | 4271753 | 6/2009 |

* cited by examiner

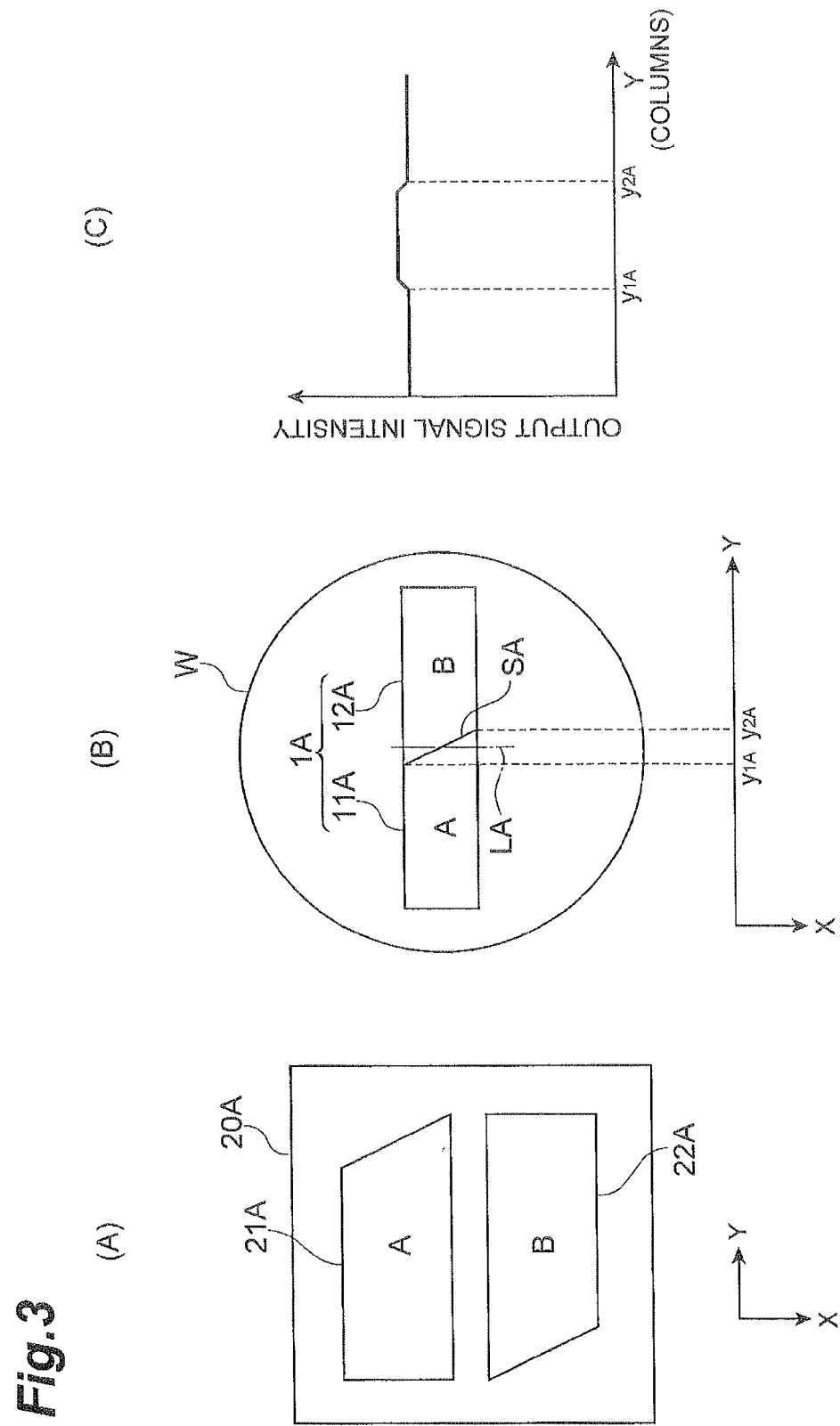

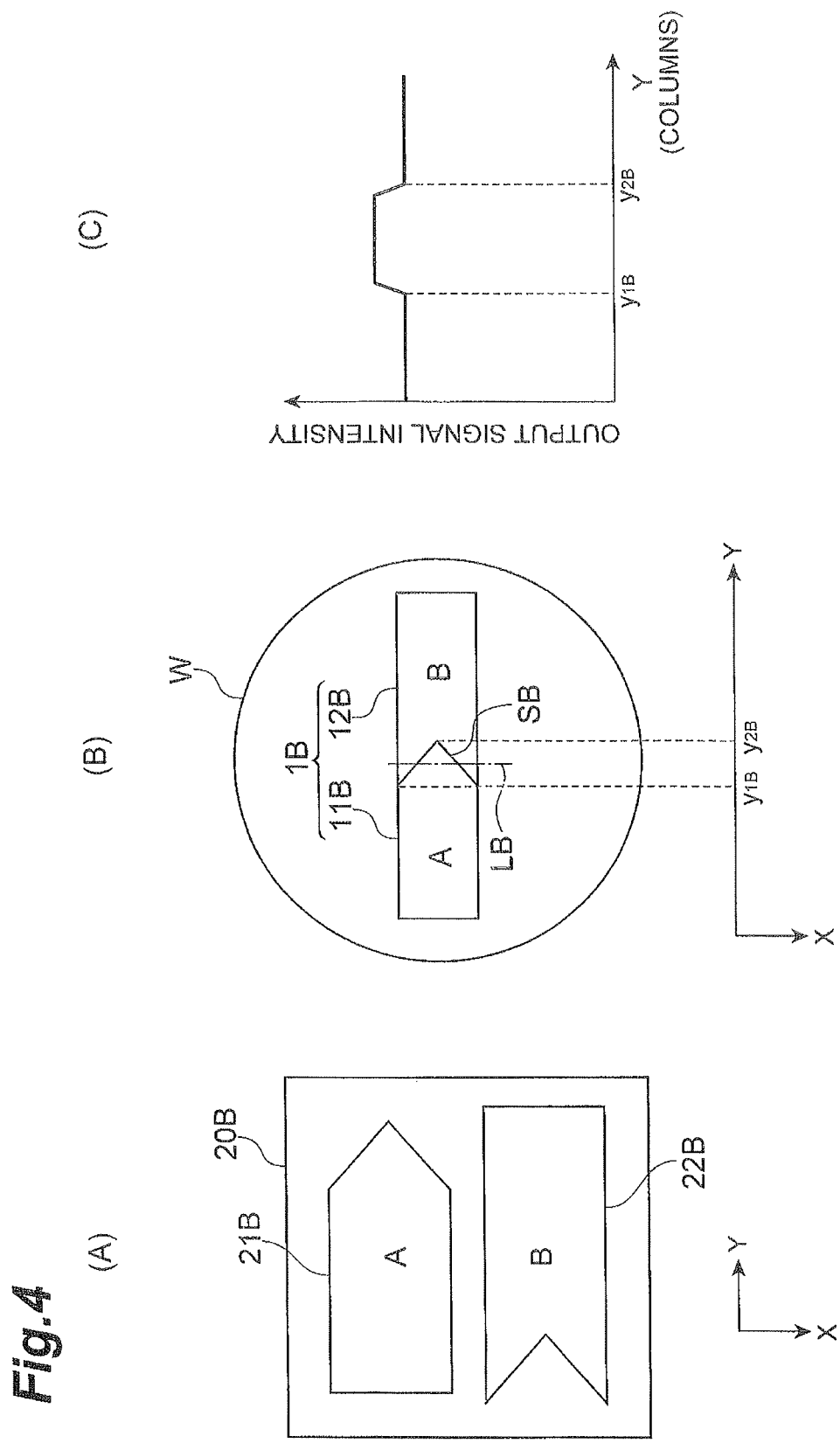

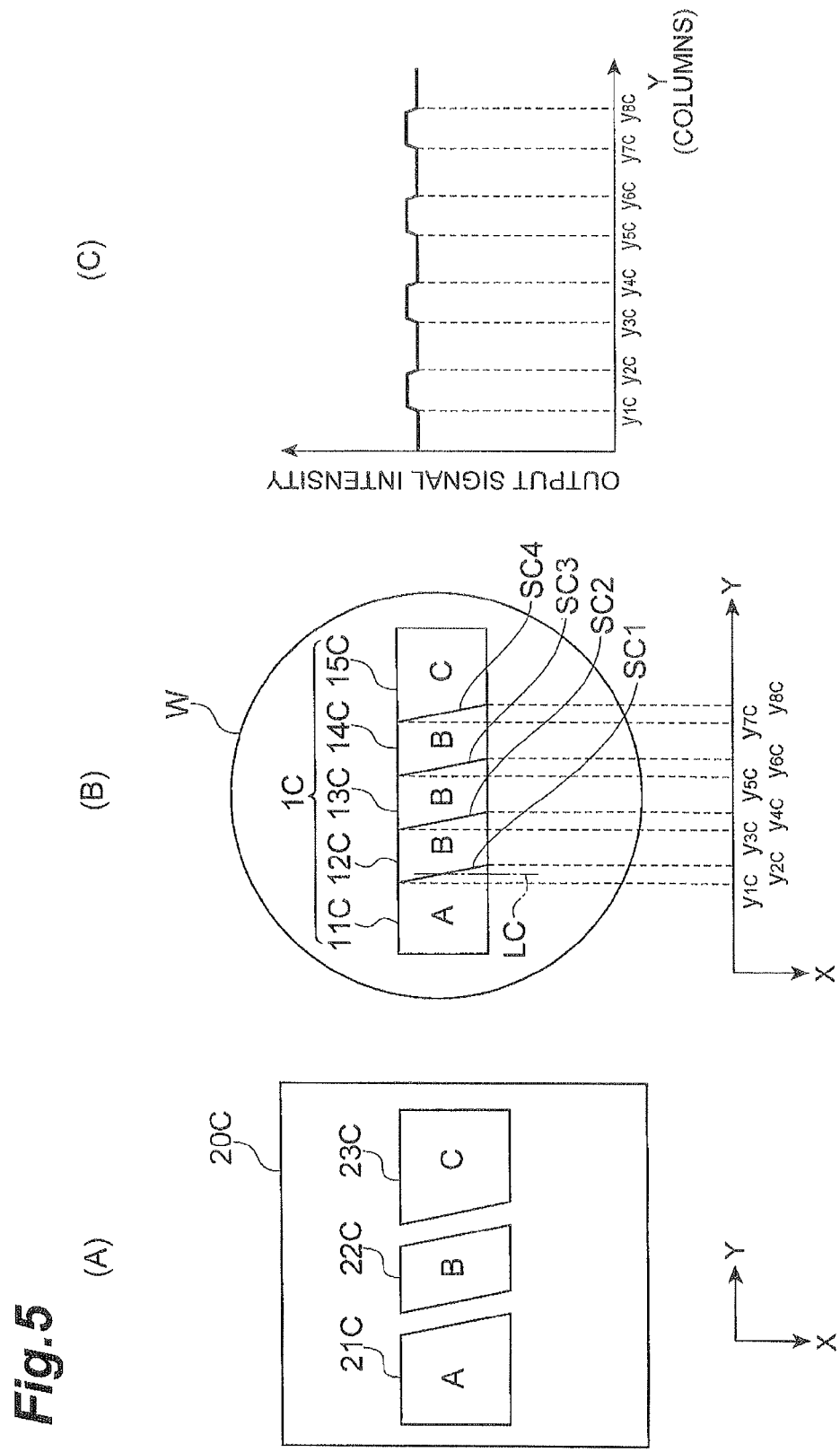

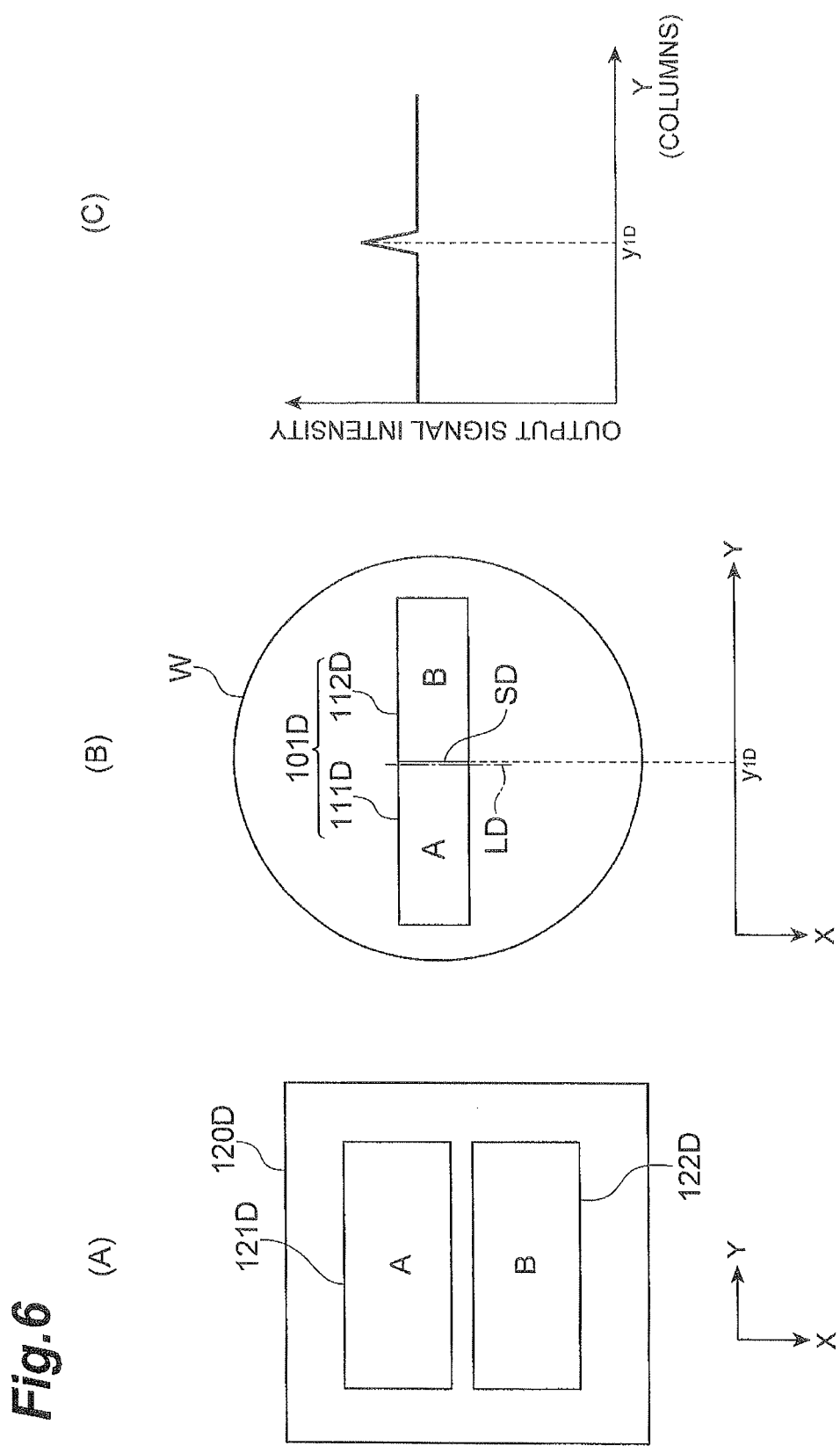

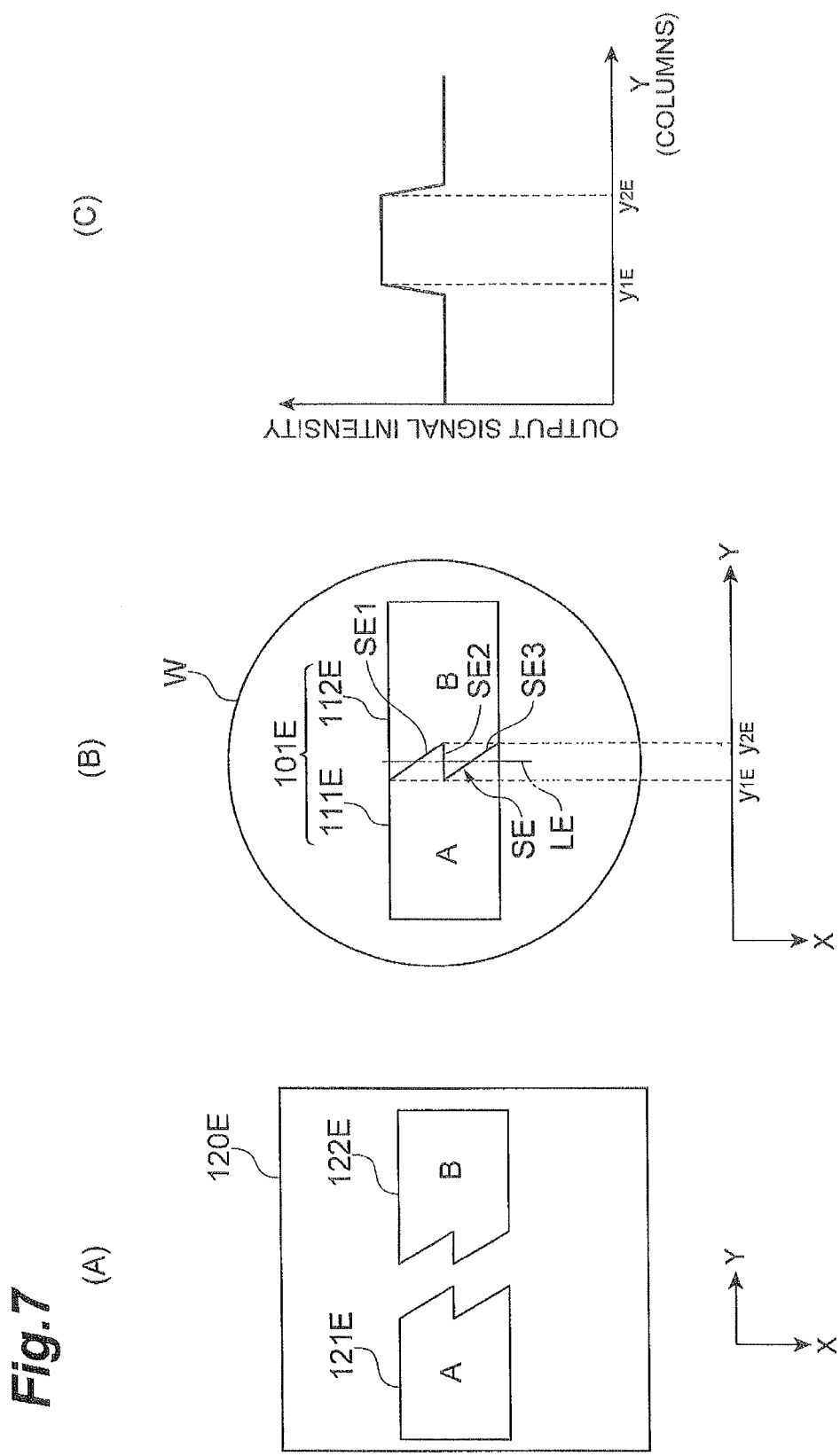

SOLID-STATE IMAGE PICKUP DEVICE AND METHOD FOR MANUFACTURING SOLID-STATE IMAGE PICKUP DEVICE

TECHNICAL FIELD

The present invention relates to a solid-state imaging device and a method for manufacturing a solid-state imaging device.

BACKGROUND ART

There are conventionally-known solid-state imaging devices with a light receiving section having a pixel structure of a matrix pattern composed of a plurality of rows and a plurality of columns (e.g., cf. Patent Literatures 1 and 2). In this solid-state imaging device, electric charges accumulated in respective pixels according to light incident on the light receiving section are transferred by voltage supplied to transfer electrodes.

An example of a method for driving the solid-state imaging device is the TDI (Time Delay and Integration) driving method of, while transferring an electric charge accumulated in a pixel to pixels on the same column at a rate corresponding to a moving speed of an object, further accumulating electric charges. The TDI driving method allows the device to clearly image an object moving at a constant speed, e.g., such as an object on a belt conveyor. Another example of the method for driving the solid-state imaging device is binning to add up electric charges generated in a predetermined number of pixels and output the sum as an output signal. The binning allows us to handle a plurality of adjacent pixels as a unit pixel.

CITATION LIST

Patent Literatures

Patent Literature 1: Japanese Patent Application Laid-open Publication No, 2000-101061
Patent Literature 2: Japanese Patent Application Laid-open Publication No. 2003-347539

SUMMARY OF INVENTION

Technical Problem

Incidentally, there is a need for improvement in sensitivity of the solid-state imaging device in recent years and there have been attempts to increase the area of the solid-state imaging device in response to the need. On the other hand, there is a limit to the area where exposure can be implemented at one time, in an exposure process during manufacture of the solid-state imaging device. For this reason, when the area of the solid-state imaging device is large, it is difficult to manufacture the solid-state imaging device by a single exposure process. Then, a technique called stitching exposure is used for manufacturing a large-area solid-state imaging device. The stitching exposure is a technique of manufacturing the solid-state imaging device by sequential exposure processes of respective regions, using a mask having patterns of shapes corresponding to a plurality of regions on a semiconductor substrate.

However, when the solid-state imaging device manufactured by the stitching exposure is driven by the TDI driving method, even if light with uniform intensity is made incident on the entire light receiving section of this solid-state imaging device, its output demonstrates a different value at a portion of a seam as a boundary between regions from the value in the portions other than the seam. Namely, the output signal becomes non-uniform in the portion of the seam.

Therefore, it is an object of the present invention to provide a solid-state imaging device capable of outputting a satisfactorily uniform output signal and a method for manufacturing the solid-state imaging device.

Solution to Problem

A solid-state imaging device according to one aspect of the present invention is a solid-state imaging device including a light receiving section formed by such exposure as to stitch a plurality of patterns together in a first direction on a semiconductor substrate. The light receiving section includes a plurality of pixels disposed in a two-dimensional array in the first direction and a second direction perpendicular to the first direction and transfers electric charges in the second direction, in each of pixel columns consisting of a plurality of pixels disposed in the second direction, among the plurality of pixels. In the light receiving section, a boundary where the plurality of patterns are stitched together is located along on at least one line segment extending in a direction intersecting with the first direction and the second direction.

In the solid-state imaging device according to one aspect of the present invention, the light receiving section is formed by such exposure as to stitch the plurality of patterns together in the first direction. This light receiving section has the plurality of pixels disposed in the two-dimensional array in the first direction and the second direction perpendicular to the first direction. Electric charges are transferred in the second direction in each of pixel columns consisting of a plurality of pixels disposed in the second direction, among the plurality of pixels. On the other hand, the boundary where the plurality of patterns are stitched together is located along on at least one line segment extending in the direction intersecting with the first direction and the second direction. Therefore, a direction in which the boundary extends is different from the array direction of the plurality of pixels constituting the pixel columns. For this reason, influence of the boundary between the plurality of patterns is not concentrated on only a specific column of pixels but is dispersed over a plurality of pixel columns. As a result, non-uniformity of the output signal from the pixel columns is relieved in the portion of the boundary between the plurality of patterns, whereby the output signal can be made satisfactorily uniform.

The boundary where the plurality of patterns are stitched together may intersect at only one location with one straight line extending in the second direction. In this case, there is at most one location where the pixel column in which electric charges are transferred along the second direction intersects with the boundary between the plurality of patterns. For this reason, the non-uniformity of the output signal due to the boundary between the plurality of patterns is further relieved, whereby the output signal can be made more uniform.

The device may be one that can be driven by the TDI driving. In this case, when an object moving at a constant speed is imaged, the solid-state imaging device is driven by the TDI driving with the moving direction of the object being set in the second direction, whereby this moving object can be imaged in a satisfactorily uniform state of the output signal.

A method for manufacturing a solid-state imaging device according to one aspect of the present invention is a method for manufacturing a solid-state imaging device includes forming a light receiving section by such exposure as to stitch a plurality of patterns together in a first direction on a semiconductor substrate. The light receiving section includes a plurality of pixels disposed in a two-dimensional array in the first direction and a second direction perpendicular to the first direction and transfers electric charges in the second direction, in each of pixel columns consisting of a plurality of pixels disposed in the second direction, among the plurality of pixels. In the light receiving section, a boundary where the plurality of patterns are stitched together is located along on at least one line segment extending in a direction intersecting with the first direction and the second direction.

Obtained by the method for manufacturing the solid-state imaging device according to one aspect of the present invention is the solid-state imaging device in which the second direction in which the electric charges are transferred is different from the direction in which the boundary between the patterns stitched together in formation of the light receiving section extends. Therefore, the non-uniformity of the output signal due to the boundary between the plurality of patterns is relieved, whereby the output signal from the solid-state imaging device can be made satisfactorily uniform.

Advantageous Effect of Invention

The present invention has successfully provided the solid-state imaging device capable of providing the satisfactorily uniform output signal and the method for manufacturing the solid-state imaging device.

BRIEF DESCRIPTION OF DRAWINGS

FIG. 3 is a schematic drawing showing a shape of patterns on a photomask used in a method for manufacturing the solid-state imaging device according to one embodiment.

FIG. 4 is a schematic view showing another shape of patterns on the photomask.

FIG. 5 is a schematic view showing another shape of patterns on the photomask.

FIG. 6 is a schematic view showing a shape of patterns on the photomask according to a comparative example.

FIG. 7 is a schematic view showing a shape of patterns on the photomask according to another comparative example.

DESCRIPTION OF EMBODIMENTS

Preferred embodiments of the present invention will be described below in detail with reference to the accompanying drawings. Identical elements or elements with identical functionality will be denoted by the same reference signs in the description, without redundant description.

Figure 1:
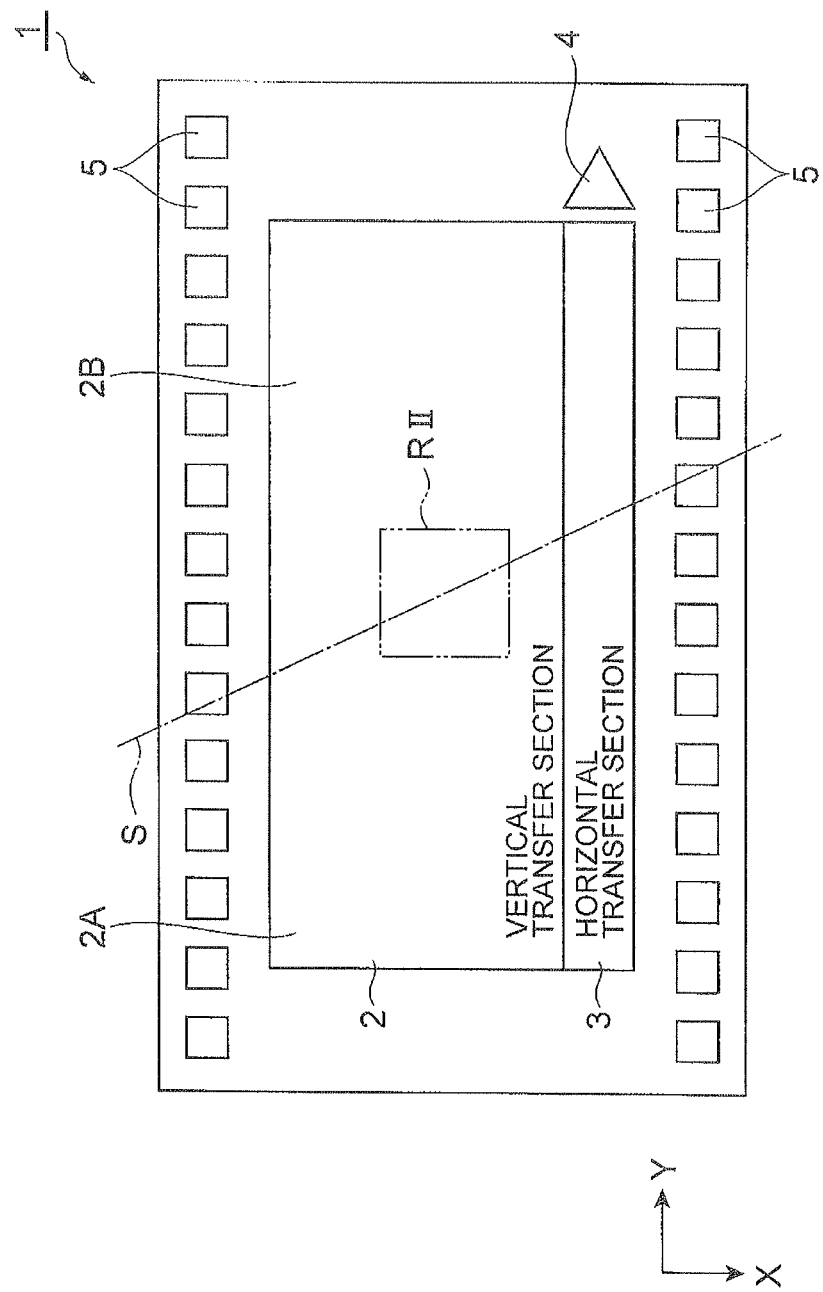
FIG. 1 is a plan view showing a schematic configuration of the solid-state imaging device according to one embodiment.
Figure 2:
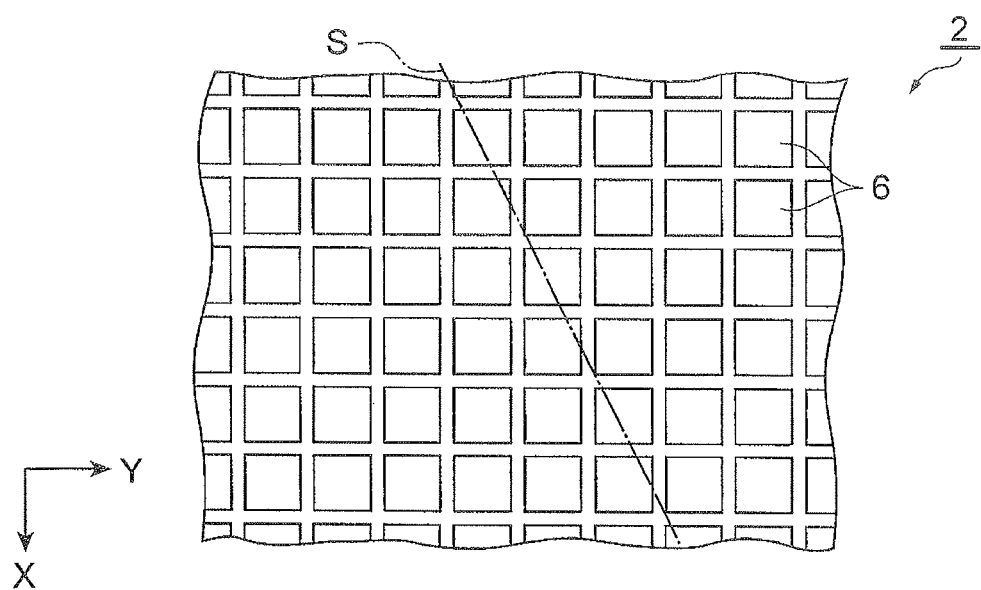
FIG. 2 is a drawing showing an enlargement of a portion in FIG. 1.

First, a configuration of the solid-state imaging device 1 according to the present embodiment will be described with reference to FIGS. 1 and 2. FIG. 1 is a plan view showing a schematic configuration of the solid-state imaging device 1. FIG. 2 is a drawing showing an enlargement of an interior of a rectangle RII in FIG. 1.

As shown in FIG. 1, the solid-state imaging device 1 has a vertical transfer section (light receiving section) 2, a horizontal transfer section 3, an output section 4, and bonding pads 5. The solid-state imaging device 1 is a solid-state imaging device that can be driven by the TDI driving, as described below.

The vertical transfer section 2 is formed by such exposure as to stitch a plurality of (two in the example shown in FIG. 1) patterns 2A, 2B together at a boundary S in a Y-axis direction (first direction) on a semiconductor substrate. As shown in FIG. 2, the vertical transfer section 2 includes a plurality of pixels 6 disposed in a two-dimensional array in the Y-axis direction and an X-axis direction (second direction) perpendicular to the Y-axis direction. Each of the pixels 6 receives light incident on the vertical transfer section 2 and generates an electric charge in an amount according to the intensity of the received light.

Among the plurality of pixels 6, a plurality of pixels 6 disposed in the X-axis direction constitute pixel columns. The vertical transfer section 2 transfers electric charges in the positive direction of the X-axis direction in each of the pixel columns. The vertical transfer section 2 includes a plurality of electrodes (not shown) extending in parallel with the Y-axis direction above the pixels 6. The vertical transfer section 2 transfers the electric charges by changing electric potentials of these electrodes so as to change the potential depth in a semiconductor layer located below the electrodes. Particularly, in the case where the solid-state imaging device 1 is driven by the TDI driving, the vertical transfer section 2 transfers the electric charges in the X-axis direction at a rate equal to a moving speed of an imaging object moving in the X-axis direction. The vertical transfer section 2 transfers the electric charges eventually to the horizontal transfer section 3.

The boundary S where the pattern 2A and the pattern 2B are stitched together in the vertical transfer section 2 is located along on at least one line segment extending in a direction intersecting with the X-axis direction and the Y-axis direction. Particularly, in the present embodiment, the boundary S is provided in a linear fashion along one line segment intersecting with both of the X-axis direction and the Y-axis direction. It is noted that the pattern 2A and the pattern 2B may include a mutually overlapping region in the vicinity of the boundary S.

The horizontal transfer section 3 transfers the electric charges having been transferred from the vertical transfer section 2, in the Y-axis direction. The horizontal transfer section 3 has electrodes (not shown) as the vertical transfer section 2 does. The horizontal transfer section 3 transfers the electric charges by changing electric potentials of the electrodes so as to change the potential depth in a semiconductor layer located below the electrodes, in the same manner as the transfer of electric charges in the vertical transfer section 2.

The output section 4 converts the electric charges having been transferred from the horizontal transfer section 3, into voltages according to the charge amounts thereof and outputs the voltages. The output section 4 to be used can be, for example, a floating diffusion amplifier.

The bonding pads 5 are used for giving the electric potentials from the outside of the solid-state imaging device 1 to the electrodes used for transferring the electric charges in the vertical transfer section 2 and the horizontal transfer section 3. The bonding pads 5 may be used for other purposes, e.g., for extracting a voltage signal output from the output section 4.

The following will describe a method for manufacturing the solid-state imaging device according to the present embodiment. This manufacturing method of the solid-state imaging device includes forming the light receiving section by such exposure as to stitch a plurality of patterns together on a semiconductor substrate.

First, a preferred shape of mask patterns on a photomask to be used in the exposure will be described with reference to FIG. 3. FIG. 3 (A) shows an example of the shape of the photomask used in the exposure to form the light receiving section. The photomask 20A includes a mask pattern 21A and a mask pattern 22A of a trapezoidal shape on the plan view.

FIG. 3 (B) shows arrangement of patterns formed on a wafer W (semiconductor substrate) when the exposure is implemented with use of the photomask 20A. On the mask W, a pattern 11A and a pattern 12A are stitched together through a boundary SA in the Y-axis direction. The pattern 11A and the pattern 12A are stitched together to form the solid-state imaging device 1A. The pattern 11A is a pattern made by exposure with the mask pattern 21A. The pattern 12A is a pattern made by exposure with the mask pattern 22A. The boundary SA is located along on a line segment extending in a direction intersecting with the X-axis direction and the Y-axis direction. Particularly, the boundary SA shown in FIG. 3 (B) intersects at only one location with one straight line LA extending along the X-axis direction.

FIG. 3 (C) shows change of output signal intensity against the Y-axis with incidence of uniform-intensity light on the solid-state imaging device 1A. Since the intensity of the light incident on the solid-state imaging device 1A is uniform, the output signal intensity should be preferably constant. In the case of the solid-state imaging device 1A, there is a slight difference of the output signal intensity between the Y-coordinate $y_{1A}$ at one end of the boundary SA and the Y-coordinate $Y_{2A}$ at the other end of the boundary SA from that in the other portions because of deviation or the like in position alignment of the pattern 11A and the pattern 12A. This difference is caused by a different relationship between the intensity of incident light and an amount of a generated electric charge in each pixel 6 located on the boundary SA from that in each pixel 6 not located on the boundary SA, because of the deviation or the like in position alignment of the pattern 11A and the pattern 12A. Each pixel column along the X-axis direction includes the pixel 6 located on the boundary SA, in the region between the Y-coordinate $y_{1A}$ and the Y-coordinate $y_{2A}$, whereas each pixel column along the X-axis direction does not include the pixel 6 located on the boundary SA, in the region where Y-coordinates are smaller than $y_{1A}$ or in the region where Y-coordinates are larger than $y_{2A}$. For this reason, as shown in FIG. 3 (C), there is the slight difference in characteristics of output signal intensity in the region between the Y-coordinate $y_{1A}$ and the Y-coordinate $y_{2A}$, when compared to the other regions. However, the difference of output signal intensity depending upon the Y-coordinates shown in FIG. 3 (C) is sufficiently small and thus the output signal intensity is found to be satisfactorily uniform from a practical viewpoint.

Next, another preferred shape of the mask patterns on the photomask to be used in the exposure will be described with reference to FIG. 4. FIG. 4 (A) shows an example of the shape of the photomask. The photomask 20B has a mask pattern 21B and a mask pattern 22B of a pentagonal shape.

FIG. 4 (B) shows arrangement of patterns formed on the wafer W when the exposure is implemented with use of the photomask 20B. On the wafer W, a pattern 11B and a pattern 12B are stitched together through a boundary SB in the Y-axis direction. The pattern 11B and the pattern 12B are stitched together to form the solid-state imaging device 1B. The pattern 11B is a pattern made by exposure with the mask pattern 21B. The pattern 12B is a pattern made by exposure with the mask pattern 22B. The boundary SB is provided as a broken line having two portions separated by one angle. The two portions are located along two respective line segments extending in respective directions intersecting with the X-axis direction and the Y-axis direction. The boundary SB shown in FIG. 4 (B) intersects at two locations with one straight line LB extending along the X-axis direction. On the boundary SB, the Y-coordinate at a point where the Y-coordinate becomes minimum is $y_{1B}$, and the Y-coordinate at a point where the Y-coordinate becomes maximum is $y_{2B}$.

FIG. 4 (C) shows change of output signal intensity against the Y-axis with incidence of uniform-intensity light on the solid-state imaging device 1B. In the case of the solid-state imaging device 1B, there is a slight difference of the output signal intensity in the region between the Y-coordinate $y_{1B}$ and the Y-coordinate $Y_{2B}$ from that in the other regions because of the deviation or the like in position alignment of the pattern 11B and the pattern 12B. This difference is slightly larger than the difference of output signal intensity between the region between the Y-coordinate $y_{1A}$ and the Y-coordinate $y_{2A}$ and the other regions, which is shown in FIG. 3 (C), but is sufficiently small, and thus the output signal intensity is found to be satisfactorily uniform from a practical viewpoint.

By comparison of the shape of the boundary SB between the patterns 11B, 12B of the solid-state imaging device 1B shown in FIG. 4 with the patterns 11A, 12A of the solid-state imaging device 1A shown in FIG. 3, their features will be described below. The pixel column along the straight line LA intersects at one location with the boundary SA, as shown in FIG. 3 (B), whereas the pixel column along the straight line LB intersects at two locations with the boundary SB, as shown in FIG. 4 (B). For this reason, the solid-state imaging device 1A is advantageous in that the output signal intensity becomes more uniform because of the smaller number of pixels located on the boundary, compared to the solid-state imaging device 1B. On the other hand, when the boundary is a straight line or a broken line along at least one line segment inclined at a fixed angle to the X-axis, the photomask 20B shown in FIG. 4 (A) is more advantageous than the photomask 20A shown in FIG. 3 (A), because the area of the photomask can be made smaller.

The number of mask patterns and the number of patterns in the vertical transfer section of the solid-state imaging device each do not have to be limited to two. The number of mask patterns and the number of patterns in the solid-state imaging device may be set to different numbers. Still another preferred shape of the mask patterns on the photomask to be used for the exposure will be described with reference to FIG. 5. FIG. 5 (A) shows an example of the shape of the photomask. The photomask 20C has a mask pattern 21C of a trapezoidal shape, a mask pattern 22C of a parallelogram shape, and a mask pattern 23C of a trapezoidal shape.

FIG. 5 (B) shows arrangement of patterns formed on the wafer W when the exposure is implemented with use of the photomask 20C. On the wafer W, patterns 11C, 12C, 13C, 14C, and 15C are stitched together through respective boundaries SC1, SC2, SC3, and SC4 in the Y-axis direction. The boundaries SC1 to SC4 are disposed along line segments each at respective fixed angles to both of the X-axis direction and the Y-axis direction. The boundaries SC1, SC2, SC3, and SC4 have respective Y-coordinates $y_{1C}$, $y_{3C}$, $y_{5C}$, and $y_{7C}$ at their respective one ends and respective Y-coordinates $y_{2C}$, $y_{4C}$, $y_{6C}$, and $y_{8C}$ at their respective other ends. The boundary SC1 intersects at one location with one straight line LC extending along the X-axis direction. Each of the boundaries SC2 to SC4 also intersects similarly at one location with a straight line extending along the X-axis direction.

The patterns 11C, 12C, 13C, 14C, and 15C are stitched together to form the solid-state imaging device 1C. The pattern 11C is made by exposure with the mask pattern 21C. The patterns 12C, 13C, and 14C are made by exposure with the mask pattern 22C. The pattern 15C is made by exposure with the mask pattern 23C. The exposure for the patterns 12C, 13C, and 14C is carried out by repetitive exposure processes with change in position of the photomask 20C relative to the wafer W.

FIG. 5 (C) shows change of output signal intensity against the Y-axis with incidence of uniform-intensity light on the solid-state imaging device 1C. In the case of the solid-state imaging device 1C, the output signal has differences in regions between the Y-coordinates $y_{1C}$ and $y_{2C}$, between the Y-coordinates $y_{3C}$ and $y_{4C}$, between the Y-coordinates $y_{5C}$ and $y_{6C}$, and between the Y-coordinates $y_{7C}$ and $y_{8C}$ from the output signal in the other regions because of the deviation or the like in position alignment of the patterns 11C to 15C. However, the differences of output signal intensity depending upon the Y-coordinates shown in FIG. 5 (C) are sufficiently small and thus the output signal intensity is found to be satisfactorily uniform from a practical viewpoint.

The below will describe comparative examples to the embodiments of the present invention, with reference to FIGS. 6 and 7. FIG. 6 (A) shows an example of the shape of the photomask according to a comparative example. The photomask 120D has a mask pattern 121D and a mask pattern 122D of a rectangular shape.

FIG. 6 (B) shows arrangement of patterns formed on the wafer W when the exposure is implemented with use of the photomask 120D. On the wafer W, a pattern 111D and a pattern 112D are stitched together through a boundary SD in the Y-axis direction. The pattern 111D and the pattern 112D are stitched together to form the solid-state imaging device 101D. The pattern 111D is a pattern made by exposure with the mask pattern 121D. The pattern 112D is a pattern made by exposure with the mask pattern 122D. The boundary SD is located along the X-axis direction. The boundary SD shown in FIG. 6 (B) is located in parallel with one straight line LD extending along the X-axis direction. The Y-coordinate of each point on the boundary SD is $y_{1D}$.

FIG. 6 (C) shows change of output signal intensity against the Y-axis with incidence of uniform-intensity light on the solid-state imaging device 101D. In the case of the solid-state imaging device 101D, there is a large difference of output signal intensity at the Y-coordinate $y_{1D}$ from the other portions because of the deviation or the like in position alignment of the pattern 111D and the pattern 112D. This difference is significantly larger than the difference of output signal intensity between the section of the Y-coordinates $y_{1A}$ to $y_{2A}$, and the other sections shown in FIG. 3. This is because the pixels 6 constituting the pixel column at the Y-coordinate $y_{1D}$ are located all on the boundary SD and thus the characteristics of output signal intensity are different from those at the pixels 6 at the other positions.

FIG. 7 shows another comparative example. FIG. 7 (A) shows an example of the shape of the photomask according to the comparative example. The photomask 120E has a mask pattern 121E and a mask pattern 122E of a hexagonal shape obtained by replacing one side of a short side of a rectangle with a broken line consisting of two sides intersecting with both of the X-axis direction and the Y-axis direction and one side connecting these sides and being parallel to the Y-axis.

FIG. 7 (B) shows arrangement of patterns formed on the wafer W when the exposure is implemented with use of the photomask 120E. On the wafer W, a pattern 111E and a pattern 112E are stitched together through a boundary SE in the Y-axis direction. The pattern 111E and the pattern 112E are stitched together to form the solid-state imaging device 101E. The pattern 111E is a pattern made by exposure with the mask pattern 121E. The pattern 112E is a pattern made by exposure with the mask pattern 122E. The boundary SE consists of portions SE1, SE3 intersecting with both of the X-axis direction and the Y-axis direction, and a portion SE2 parallel to the Y-axis direction. The boundary SE shown in FIG. 6 (B) intersects at three locations with one straight line LE extending along the X-axis direction. The Y-coordinate $y_{1D}$ of each point on the boundary line SE is $y_{1D}$.

FIG. 7 (C) shows change of output signal intensity against the Y-axis with incidence of uniform-intensity light on the solid-state imaging device 101E. In the case of the solid-state imaging device 101E, there is a large difference of output signal intensity at the Y-coordinates $y_{1E}$ to $y_{2E}$ from that in the other portions because of the deviation or the like in position alignment of the pattern 111E and the pattern 112E. This difference is larger than the difference of output signal intensity between the section of the Y-coordinates $y_{1E}$ to $y_{2E}$ and the other sections shown in FIG. 4. This is because the portion SE2 parallel to the Y-axis direction exists in the boundary SE whereby there are the pixels 6 located on the portion SE2, out of the pixels 6 constituting the pixel columns located in the section of the Y-coordinates $y_{1E}$ to $y_{2E}$, so as to increase the number of pixels 6 located on the boundary SE. As described above, the provision of the portion parallel to the Y-axis direction on the boundary between the patterns is not preferable because it makes the characteristics of output signal intensity non-uniform.

In the solid-state imaging device 1 according to the embodiment of the present invention, the vertical transfer section 2 is formed by such exposure as to stitch the plurality of patterns 11, 12 together in the first direction. This vertical transfer section 2 has the plurality of pixels 6 disposed in the two-dimensional array in the X-axis direction and the Y-axis direction perpendicular to the X-axis direction. Electric charges are transferred in the X-axis direction in each of the pixel columns consisting of the plurality of pixels disposed in the X-axis direction, among the plurality of pixels 6. On the other hand, the boundary where the plurality of patterns are stitched together is located along on at least one line segment extending in the direction intersecting with the X-axis direction and the Y-axis direction. Therefore, a direction in which the boundary extends is different from the array direction of the plurality of pixels 6 constituting the pixel columns. For this reason, influence of the boundary between the plurality of patterns is not concentrated on only a specific column of pixels 6 but is dispersed over a plurality of pixel columns. As a result, the non-uniformity of the output signal from the pixel columns is relieved in the portion of the boundary between the plurality of patterns, whereby the output signal can be made satisfactorily uniform.

In the case where the boundary where the plurality of patterns 11, 12 are stitched together intersects at only one location with one straight line extending in the X-axis direction, there is one location where the pixel line in which the electric charges are transferred along the X-axis direction intersects with the boundary between the plurality of patterns 11, 12. For this reason, the non-uniformity of the output signal due to the boundary between the plurality of patterns is further relieved, whereby the output signal can be made more uniform.

When the solid-state imaging device 1 can be driven by the TDI driving and when an object moving at a constant speed is imaged, the solid-state imaging device is driven by the TDI driving with the moving direction of the object being set in the X-axis direction, whereby this moving object can be imaged in a satisfactorily uniform state of the output signal.

The embodiment of the invention is the method for manufacturing the solid-state imaging device including the light receiving section including the plurality of pixels disposed in the two-dimensional array in the first direction and the second direction perpendicular to the first direction and transferring the electric charges in the second direction, in each of the pixel columns consisting of the plurality of pixels disposed in the second direction, among the plurality of pixels, the method includes forming the light receiving section by such exposure as to stitch the plurality of patterns together in the first direction on the semiconductor substrate. In formation of the light receiving section, the boundary where the plurality of patterns are stitched together is located along on at least one line segment extending in the direction intersecting with the first direction and the second direction.

The above described the preferred embodiments of the present invention but it should be noted that the present invention is not limited to the above-described embodiments. The shape of the boundary between the patterns may be any shape, without having to be limited to those shown in FIGS. 3 to 5, as long as the boundary between the patterns is located along on at least one line segment extending in the direction intersecting with the first direction and the second direction. Furthermore, the solid-state imaging device of the present invention may be one in which electric charges are transferred so as to implement binning to handle a plurality of adjacent pixels as a unit pixel.

INDUSTRIAL APPLICABILITY

The present invention is applicable to the solid-state imaging devices and the methods for manufacturing the solid-state imaging devices.

REFERENCE SIGNS LIST

1 solid-state imaging device; 2 vertical transfer section (light receiving section); 2A, 2B, 11A, 12A, 11B, 12B, and 11C to 15C patterns; 3 horizontal transfer section; 6 pixels; W wafer (semiconductor substrate).

The invention claimed is:

1. A solid-state imaging device comprising a light receiving section formed by such exposure as to stitch a plurality of patterns together in a first direction on a semiconductor substrate,
   wherein the light receiving section includes a plurality of pixels disposed in a two-dimensional array in the first direction and a second direction perpendicular to the first direction and transfers electric charges in the second direction, in each of pixel columns consisting of a plurality of pixels disposed in the second direction, among the plurality of pixels, and
   wherein in the light receiving section, an entire boundary where the plurality of patterns are stitched together is located along on at least one line segment extending in a direction intersecting with the first direction and the second direction.

2. The solid-state imaging device according to claim 1, wherein the boundary where the plurality of patterns are stitched together intersects at only one location with one straight line extending in the second direction.

3. The solid-state imaging device according to claim 1, which can be driven by TDI driving.

4. A method for manufacturing a solid-state imaging device, comprising a step of forming a light receiving section by such exposure as to stitch a plurality of patterns together in a first direction on a semiconductor substrate,
   wherein the light receiving section includes a plurality of pixels disposed in a two-dimensional array in the first direction and a second direction perpendicular to the first direction and transfers electric charges in the second direction, in each of pixel columns consisting of a plurality of pixels disposed in the second direction, among the plurality of pixels, and
   wherein in the light receiving section, an entire boundary where the plurality of patterns are stitched together is located along on at least one line segment extending in a direction intersecting with the first direction and the second direction.

* * * * *